(12) United States Patent
Vanderpot

(10) Patent No.: US 6,172,372 B1
(45) Date of Patent: Jan. 9, 2001

(54) SCANNING SYSTEM WITH LINEAR GAS BEARINGS AND ACTIVE COUNTER-BALANCE OPTIONS

(75) Inventor: John W. Vanderpot, Boxford, MA (US)

(73) Assignee: Varian Semiconductor Equipment Associates, Inc., Gloucester, MA (US)

( * ) Notice: Under 35 U.S.C. 154(b), the term of this patent shall be extended for 0 days.

(21) Appl. No.: 09/132,726

(22) Filed: Aug. 12, 1998

Related U.S. Application Data

(60) Provisional application No. 60/055,265, filed on Aug. 13, 1997.

(51) Int. Cl.$^7$ .................................................. H01J 37/30
(52) U.S. Cl. ................................ 250/492.21; 250/442.11
(58) Field of Search ........................ 250/442.11, 492.21, 250/398

(56) References Cited

U.S. PATENT DOCUMENTS

| | | | |
|---|---|---|---|
| 4,457,803 | 7/1984 | Takigawa | 156/626 |
| 4,680,474 | 7/1987 | Turner et al. | 250/492.2 |
| 4,683,378 | 7/1987 | Shimase et al. | 250/492.2 |
| 4,726,689 * | 2/1988 | Pollock | 384/12 |
| 4,828,403 * | 5/1989 | Schwartzman | 384/100 |
| 4,899,059 | 2/1990 | Freytsis et al. | 250/492.2 |
| 4,922,106 * | 5/1990 | Berrian et al. | 250/492.21 |
| 4,936,968 | 6/1990 | Ohnishi et al. | 204/192.34 |
| 4,980,562 | 12/1990 | Berrian et al. | 250/492.2 |
| 5,028,795 * | 7/1991 | Sakurada et al. | 250/492.21 |
| 5,223,109 | 6/1993 | Itoh et al. | 204/192.34 |
| 5,525,807 * | 6/1996 | Hirokawa et al. | 250/492.21 |
| 5,583,344 | 12/1996 | Mizumura et al. | 250/492.21 |
| 5,608,223 * | 3/1997 | Hirokawa et al. | 250/492.21 |
| 5,641,969 * | 6/1997 | Cooke et al. | 250/492.21 |
| 5,753,923 * | 5/1998 | Mera et al. | 250/492.21 |

OTHER PUBLICATIONS

Forn PCT/ISA/210 (second sheet) in International Search Report, Application No. PCT/US98/16630, Oct. 19, 1998 (Date of search completion).

* cited by examiner

*Primary Examiner*—Bruce C. Anderson
(74) *Attorney, Agent, or Firm*—Wolf, Greenfield & Sacks, P.C.

(57) ABSTRACT

An ion beam scanning system includes an ion beam processing chamber and a shaft extending through two opposing walls of the chamber. Linear gas bearings couple the shaft through the walls to provide for rotational and linear movement of the shaft. An ion source and scanning unit generates an ion beam and scans a workpiece mounted on the shaft. The ion beam irradiates the workpiece at a selected angle, relative to the surface normal of the workpiece, defined by rotation of the shaft. A linear drive linearly moves the shaft so that the ion beam creates a raster pattern on the workpiece. The system can include counter-balancing of the shaft to ease the work of the drive units. Batch processing can be achieved through a rotatable disc mounted to the shaft, whereby each workpiece is processed by rotation of the disc and simultaneous linear motion of the shaft. One processing system can also include two mounting structures, one for loading/unloading during simultaneous processing of workpieces on another structure.

15 Claims, 11 Drawing Sheets

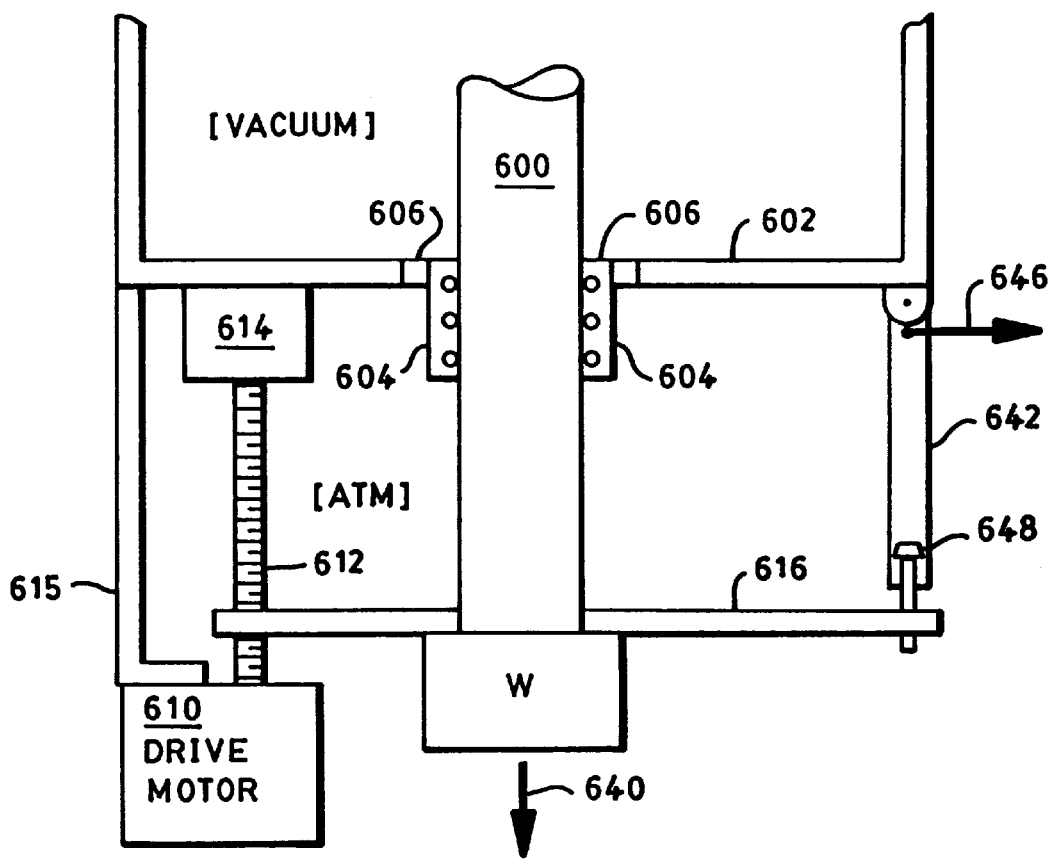
FIG. 6A
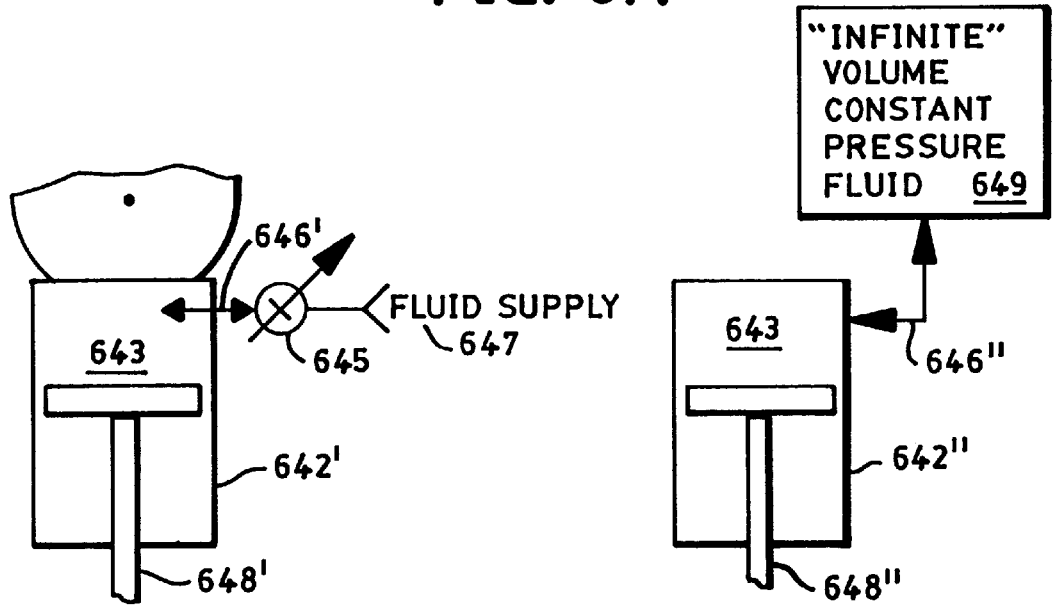
FIG. 6A1      FIG. 6A2

SCANNING SYSTEM WITH LINEAR GAS BEARINGS AND ACTIVE COUNTER-BALANCE OPTIONS

RELATED APPLICATIONS

This application is a continuing application of commonly-owned and co-pending U.S. Provisional Application No. 60/055,265, filed on Aug. 13, 1997 and herein incorporated by reference.

BACKGROUND OF THE INVENTION

The prior art is familiar with systems which scan ion beams across target objects so as to selectively dope the target surface. U.S. Pat. No. 5,028,795, entitled "Ion Implantation Apparatus" describes one such system. In the '795 patent, two multipole electrostatic deflectors are used to scan the beam in two dimensions across the target surface.

The prior art is also familiar with magnetically-controlled ion beam scanning systems. U.S. Pat. No. 4,922,106, entitled "Ion Beam Scanning Method and Apparatus," describes one such system. In the '106 patent, a magnetic deflector with two truncated sector-shaped poles is used to control the ion beam so as to maintain a parallel beam path and a scan direction.

The prior art is further aware of systems which mechanically scan the target object in one direction, and which electrostatically or magnetically scan the beam in the other direction. In combination, therefore, such systems provide a raster scan that fully covers the target object surface. U.S. Pat. No. 4,726,689, entitled "Linear Gas Bearing with Integral Vacuum Seal for use in Serial Process Ion Beam Implantation Apparatus," describes one related system. In the '689 patent, linear gas bearings are used to provide both linear axial motion and a high differential pressure link between ambient pressure and the internal chamber vacuum.

Increasing requirements for scanning speed and accuracy require improvements to the above systems so as to provide low friction shaft control with minimal shaft vibration. One object of the invention is thus to provide such improvements.

One problem with the prior art systems is that the steps of loading and unloading workpieces onto the shaft are difficult and time-consuming, reducing production efficiency. It is thus another object of the invention to provide new and improved methods for loading and unloading objects onto ion scanning shafts, thus improving production throughput. Still another object of the invention is to provide "batch" loading of workpieces onto scanning shafts. These and other objects will become apparent in the description which follows.

SUMMARY OF THE INVENTION

As discussed above, U.S. Pat. No. 5,028,795 describes scanning and applying an ion beam to target objects, and is accordingly incorporated herein by reference. U.S. Pat. No. 4,922,106 describes magnetically scanning ion beams in one dimension, and is accordingly incorporated herein by reference. U.S. Pat. No. 4,726,689 describes coupling a shaft into an ion beam processing chamber via linear gas bearings, and is accordingly incorporated herein by reference.

The following patents provide other useful information for the invention: U.S. Pat. No. 5,223,109; U.S. Pat. No. 4,936,968; U.S. Pat. No. 4,683,378; U.S. Pat. No. 4,457,803; U.S. Pat. No. 5,583,344; U.S. Pat. No. 4,680,474; and U.S. Pat. No. 4,980,562. These patents are herein incorporated by reference.

As used herein, "workpiece" refers to the part or object to be processed within a processing chamber. For example, in semiconductor manufacturing, a substrate which is scanned and doped by ion beams is one such workpiece.

In one aspect, the invention provides an ion beam processing system which mounts a workpiece onto a shaft that extends through both sides of the processing chamber. Linear gas (or air) bearings are coupled between the shaft and the chamber walls—such as described in the above-referenced U.S. Pat. No. 4,726,689—to provide good decoupling between outside ambient and the typically-evacuated region internal to the chamber. The shaft is counter-balanced in this configuration since it extends through the wall on both sides of the chamber.

The operation of the shaft is to provide both linear and rotational motions. That is, a linear drive unit couples to the shaft, external to the chamber, so as to drive the shaft in one direction that is substantially perpendicular to the ion beam ("perpendicular" is used in this sentence to refer to ion beams that are within about ten degrees from the surface normal of the target surface). A corresponding ion beam source and scanning unit—such as described in the above-referenced patents—scans the beam in the other dimension such that, in combination with the linear drive, a raster scan can be obtained onto workpieces mounted to the shaft within the chamber.

A rotational drive unit is also connected to the shaft to provide selective incident angles for the ion beam. A beam which is normal to the workpiece will tend to channel into the target, an unwanted effect. Therefore, a slight angle of incidence between about three and ten degrees is desirable and obtainable through rotation of the shaft by the rotational drive unit.

The rotational drive unit can further be used to mount and dismount workpieces onto the shaft. That is, it is convenient to mount the workpiece onto the shaft in one orientation (generally such that the workpiece can be positioned at its preferred mounting position by operation of gravity), and then to rotate the workpiece so as to scan the workpiece along another axis. Therefore, in other aspects, the shaft is rotated to accommodate mounting and dismounting of workpieces thereon, selectively.

U.S. Pat. No. 4,726,689 teaches counter-balancing a shaft within an ion implantation chamber by the competing forces of gravity and the pressure differential created by the shaft as a seal between the vacuum chamber and outer ambient pressure. Counter-balancing reduces the forces required to drive the shaft linearly or rotationally. One problem with the prior art counter-balancing technique is that it requires a certain orientation of the shaft—i.e., the shaft longitudinal axis must be substantially parallel to the gravity vector—greatly reducing system flexibility.

In accord with another aspect of the invention, "active" counter-balancing is provided to achieve greater flexibility and control of the shaft. In certain aspects, active counter-balancing is achieved through mechanical weights, air and/or pneumatic subsystems, motors with lead screws or other high-torque motors, magnetic counter-balancing, and unidirectional gravitational counterbalance. Note, in addition, that the certain aspects described herein are "self-counterbalancing" such as when the shaft extends through both sides of the processing chamber.

In still another aspect of the invention, a two phase scanning system is provided. In this aspect, a shaft is coupled, via linear gas bearings, through opposing sides of a processing chamber. Two mounting surfaces are included on the shaft: one mounting surface provides for loading and unloading of processing workpieces; while the other mounting surface provides for processing of other workpieces. In this manner, utilization of a process chamber, e.g., an ion beam implantation system, is much higher than prior art systems which are essentially inactive during load and unload of workpieces.

The invention is next described further in connection with preferred embodiments, and it will become apparent that various additions, subtractions, and modifications can be made by those skilled in the art without departing from the scope of the invention.

BRIEF DESCRIPTION OF THE DRAWINGS

A more complete understanding of the invention may be obtained by reference to the drawings, in which:

FIG. 6A illustrates one counter-balancing embodiment of the invention utilizing a constant pressure piston;

FIGS. 6A1 and 6A2 illustrate mechanisms for maintaining constant pressure within the piston of FIG. 6A, in accord with the invention;

DETAILED DESCRIPTION OF THE DRAWINGS

Figure 1:
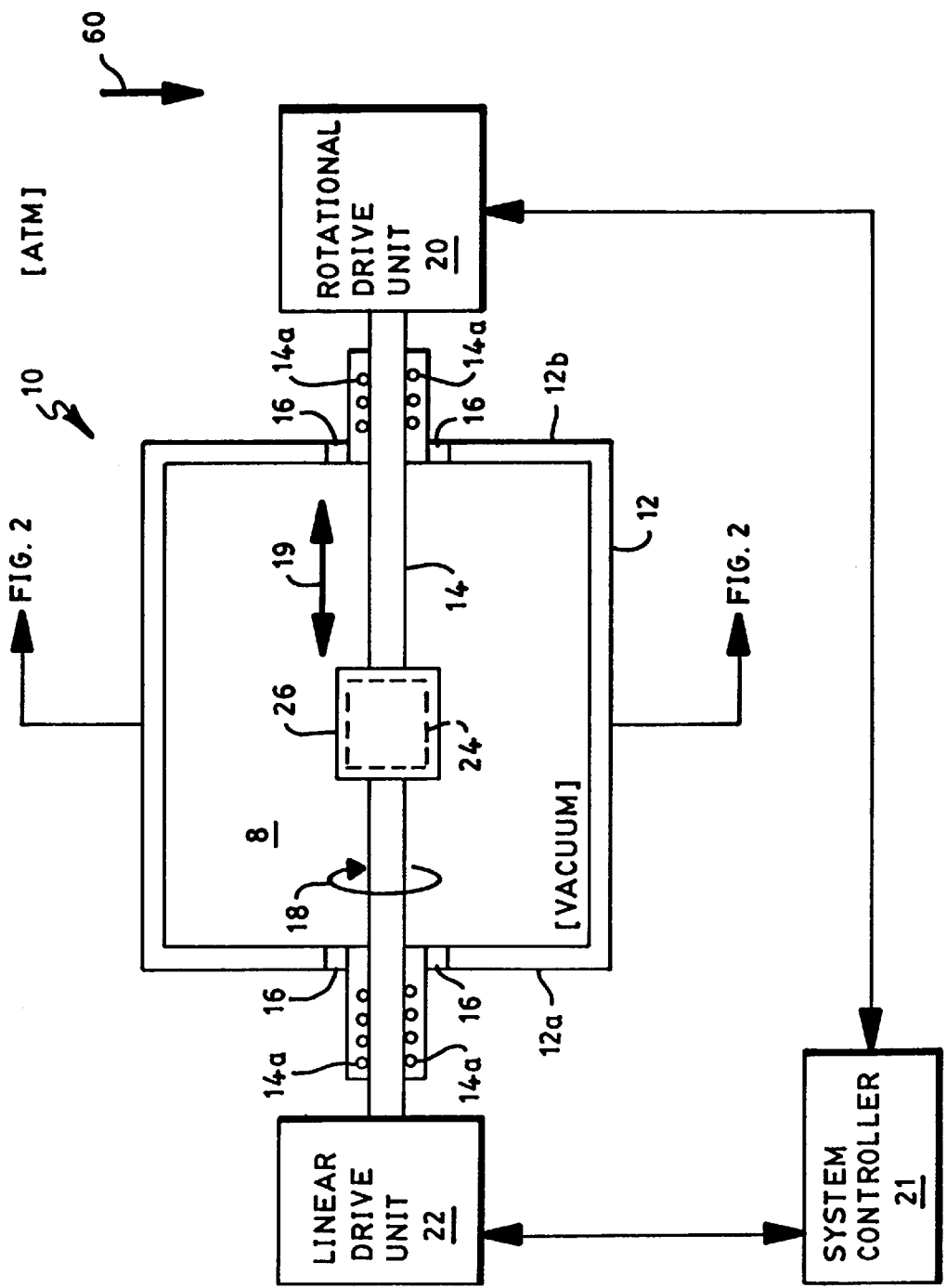
FIG. 1 shows a cross-sectional view of one ion beam scanning system of the invention.

FIG. 1 shows a cross-sectional view of an ion beam scanning system 10 constructed according to the invention. The system 10 includes a processing chamber 12, and a rotatable shaft 14 extending through opposing walls 12a, 12b of the chamber 12. Compliant mounts 16 accommodate slight misalignment of the shaft through the opposing walls 12a, 12b, particularly during rotation of the shaft 14 in direction 18.

The shaft 14 mounts through the walls 12a, 12b via coupling with the linear gas bearings 14a, known to those skilled in the art. The bearings 14a provide high stiffness, long life and a pressure barrier between ambient, external to the chamber 12, and the typically evacuated volume 8 within the chamber 12. They further permit rotational movement of the shaft 14 about direction 18, and linear motion of the shaft 14 along direction 19. Rotation of the shaft 14 in direction 18 is made through operation of the rotational drive unit 20, known to those skilled in the art. Linear motion of the shaft is made through operation of the linear drive unit 22, also known to those skilled in the art. The units 20, 22 are preferably controlled through a computer or system controller 21 with active feedback and/or with a user command interface.

A workpiece 24 is placed onto the shaft 14 by way of the mounting structure 26. In operation, such as when first placing the workpiece 24 onto the structure 26, the shaft 14 is rotated into a first position. Before the ion beam (not shown in FIG. 1) scans the workpiece 24, the shaft 14 is usually rotated to a second position that is 90 degrees to the first position.

Note that the shaft 14 of FIG. 1 is self-counter balanced. That is, the forces acting on the shaft 14 are equal on either side of the chamber 12; and thus the required torques generated by the units 20, 22 are substantially reduced.

Figure 1A:
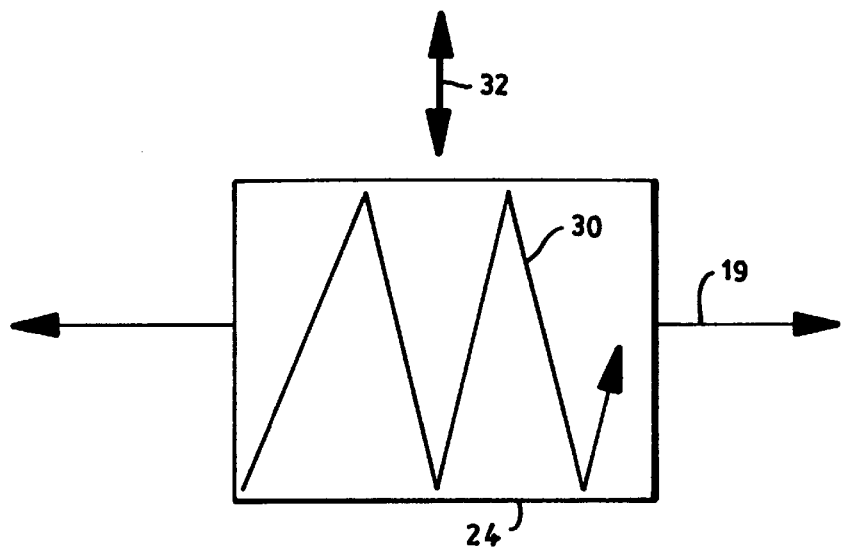
FIG. 1A shows a raster scan pattern generated on a workpiece by combined operation of the linear drive unit and the ion source and scanning unit constructed according to the invention.

The ion source and scan unit 50 (shown in FIG. 2) operates to scan a beam substantially perpendicular to the direction 19 so that the beam scans over the entire workpiece 24. FIG. 1A shows the scan pattern 30 generated by the beam relative to the scan direction 19. In particular, the unit 50 scans the beam up and down in a pattern 32, while the linear drive unit moves the workpiece 24 along direction 19. The scan pattern 30 results with the combined movements of the ion source and scanning unit 50 and the linear drive unit 22. The scan unit 50 can also be coupled for feedback and/or control with the system controller 21, as shown.

Figure 2:
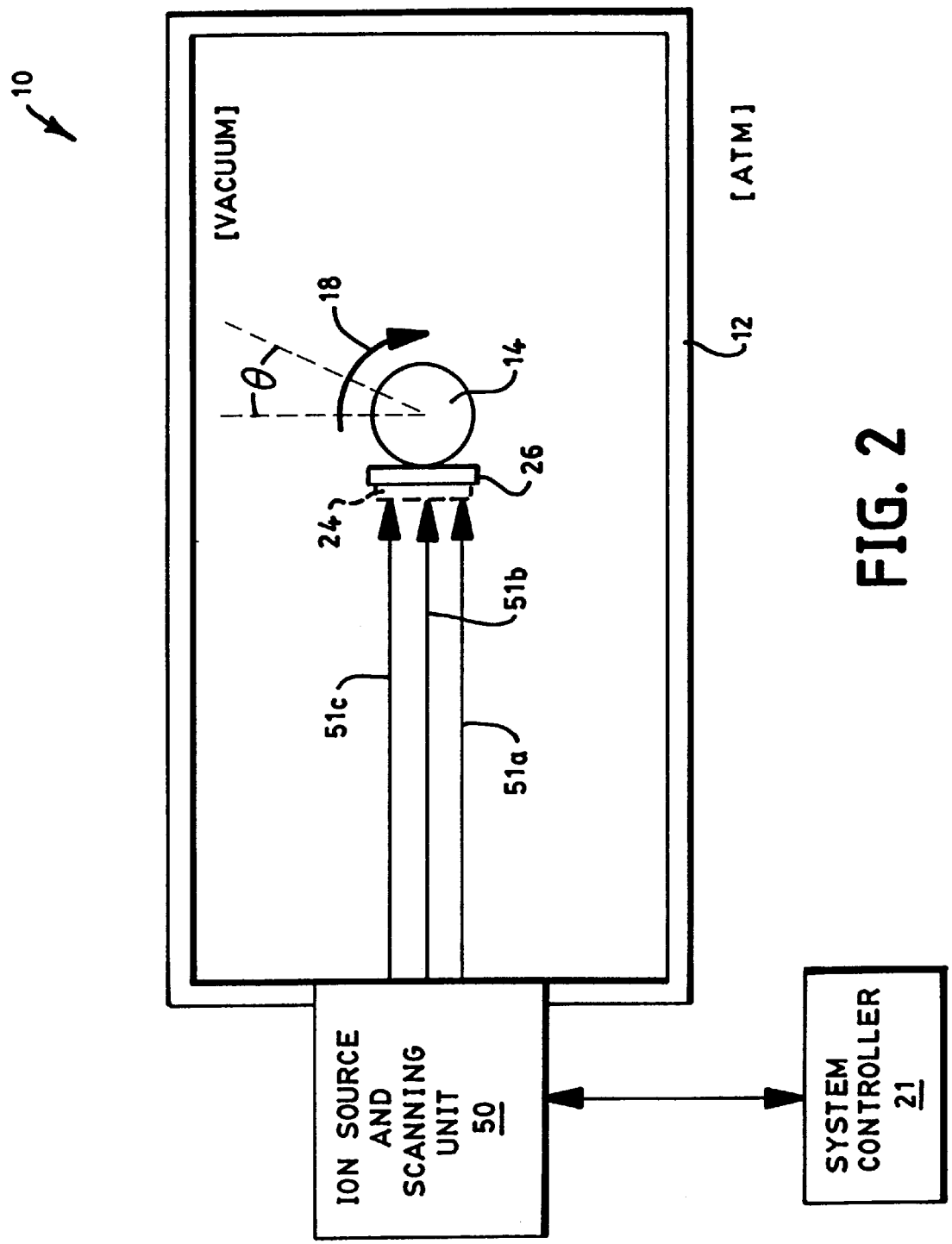
FIG. 2 shows a cross-sectional view, perpendicular to the view of FIG. 1, of the system of FIG. 1.

FIG. 2 shows a cross-sectional view of the system 10 of FIG. 1; and further illustrates the ion source and scanning unit 50. The unit 50 is described in connection with several of the patents incorporated herein by reference. The unit 50 generates a beam 51 shown illustratively in three positions 51a–51c, representing scan motion 32 of FIG. 1A. Note that the beam 51 is substantially parallel to the workpiece 24. However, the rotational drive unit 20 is preferably commanded to rotate the shaft 14 to an angle θ that is between about three and ten degrees so as to prevent unwanted channeling through the workpiece 24.

Note that the beams 51 are substantially parallel to one another such as through the techniques described in U.S. Pat. No. 4,922,106. Parallel beams 51 are preferred but are not necessary; and other ion beam scanning configurations are known to those skilled in the art and are applicable for use with the invention.

Figure 3:
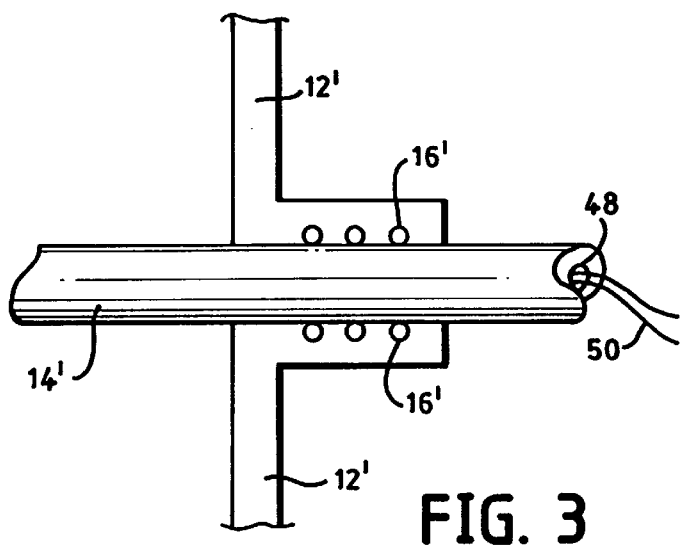
FIG. 3 shows a portion of a shaft and a chamber constructed according to the invention.

FIG. 3 illustrates a side view of a portion of the chamber wall 12' and a shaft 14'. Preferably, the shaft 14' is hollow so as to form an interior 48 that provides access for various wires 50 that connect the system 10 to control and other electronics. Accordingly, electrical feedthrough is attained directly through the shaft 14', reducing overall system complexity.

The system provides certain advantages over the prior art. First, the shaft 14 provides its own counter-balance to gravity, which is preferably oriented perpendicular to the shaft during operation. This is important especially in view of rotational scanning which is done at high RPMs to prevent or minimize jitter and associated scan non-uniformities. As illustrated in FIG. 1, for example, if the gravitational vector is aligned with vector 60, then there is substantially zero net gravitational force pulling the shaft 14.

The use of gas bearings is also advantageous in accord with the invention. They are very stiff and have long lifetimes. They further provide good sealing between ambient pressure, i.e., "[ATM]", and the internal vaccum within the chamber, i.e., "[VACUUM]".

Figure 3A:
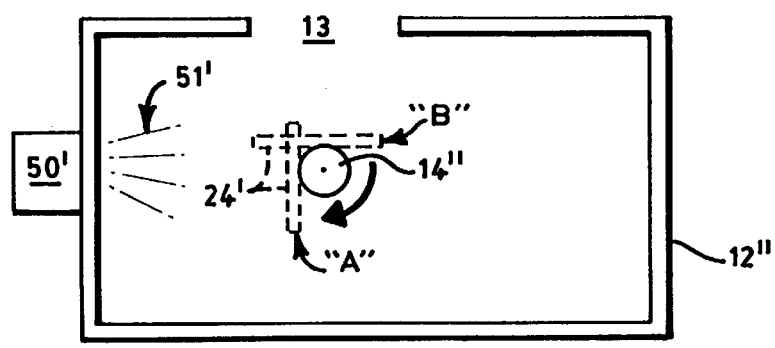
FIG. 3A illustrates loading and unloading wafers in accord with one embodiment of the invention.

Finally, the shaft configuration shown in FIGS. 1 and 2 permit easy loading and unloading of objects onto the shaft, as illustrated in FIG. 3A. By rotating the shaft 14" such that the workpiece 24' normal is facing upwards and parallel to the gravitational field (position "B" in FIG. 3A), a user can easily mount the workpiece 24' onto the mounting structure such as through a chamber opening 13. Once mounted and affixed to the structure, the opening 13 to the chamber 12' is closed and the workpiece 24' is rotated to the desired angle θ relative to the ion beam 51' (position "A" of FIG. 3A).

Figure 4:
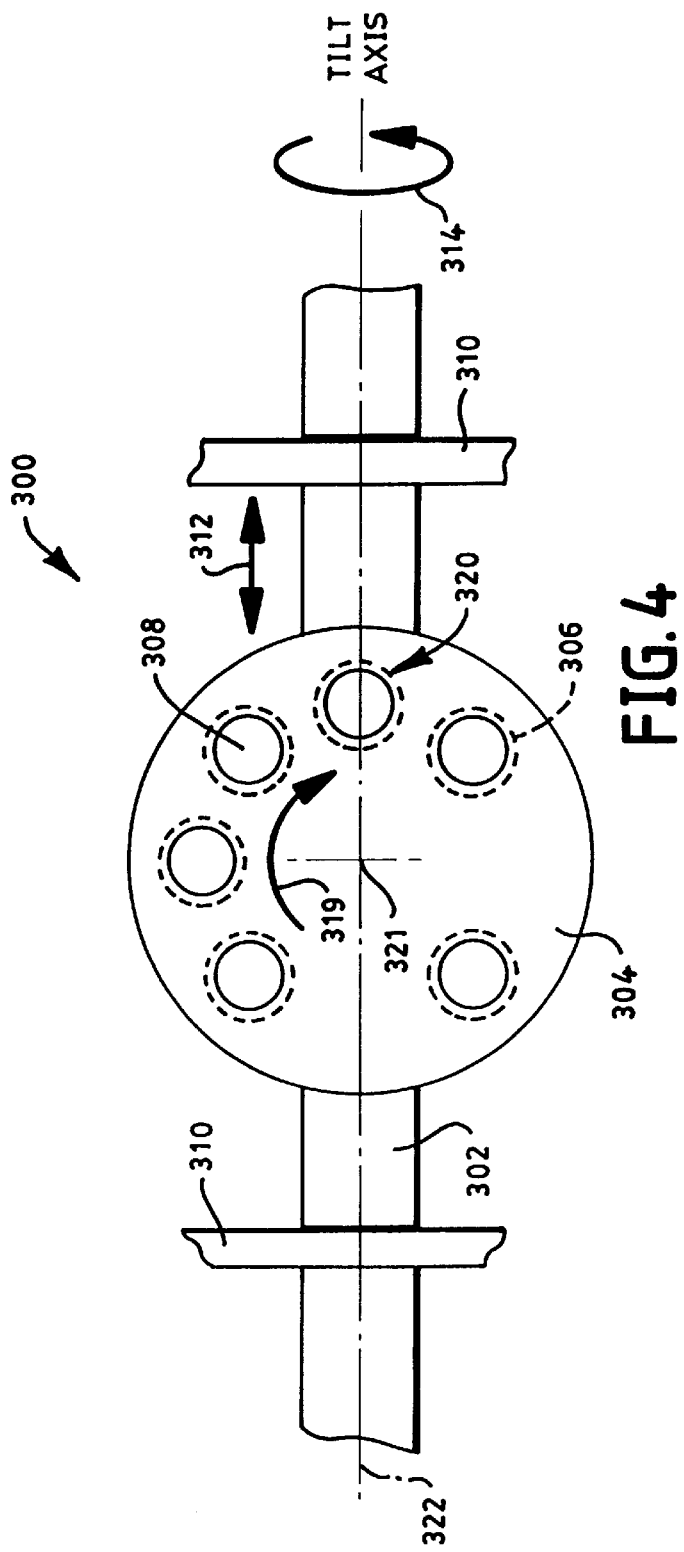
FIG. 4 illustrates a batch process ion scanning system constructed according to the invention.

FIG. 4 shows a system 300 used to batch-process multiple workpieces simultaneously. A shaft 302 operates much like the shaft 14 discussed above; however a mounting disc 304 provides a plurality of mounting locations 306 for the target workpieces 308. The mounting disc 304 is similar to the mounting surface 26 of FIG. 1 except that, for example, the disc 304 is rotatable and provides multiple mounting locations 306. For clarity of illustration, only a portion of the chamber wall 310 (similar to the wall 12) is illustrated.

As above, the shaft 302 can move in direction 312 so as to provide linear movement, and can additionally move in direction 314 for rotational movement. The direction 314 provides "tilt" to achieve the desired angle θ to prevent channeling within workpieces 308 mounted to the disc 304.

Figure 4A:
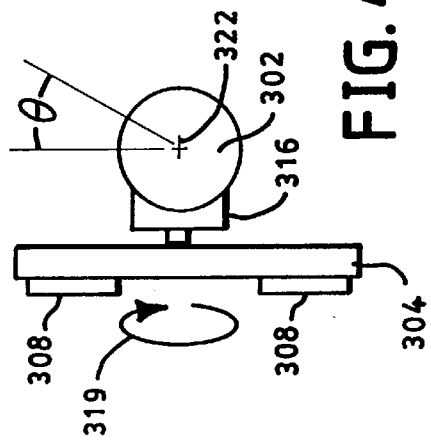
FIG. 4A shows a partial side view of the system of FIG. 4.

Since the mounting disc 304 provides for batch processing, a plurality of workpieces 308 are mounted on the disc 304; and a rotating drive motor 316 (FIG. 4A) rotates the disc 304 to desired positions along direction 319. By way of example, the workpiece 320 in FIG. 4 is in one position suitable for irradiation by the ion beam and scanning unit (discussed above). Preferably, the disc 304 mounts for rotation at a point 321 corresponding to the center line 322 of the shaft 302.

In the preferred operation, the disc 304 is rotated quickly along direction 319, as compared to the linear motion (along direction 312) of the shaft 302 so as to achieve the desired ion doping on the multiple workpieces 308. The tilt angle θ set by rotation of the shaft 302 along direction 314 is typically set once for a given scan.

Figure 5:
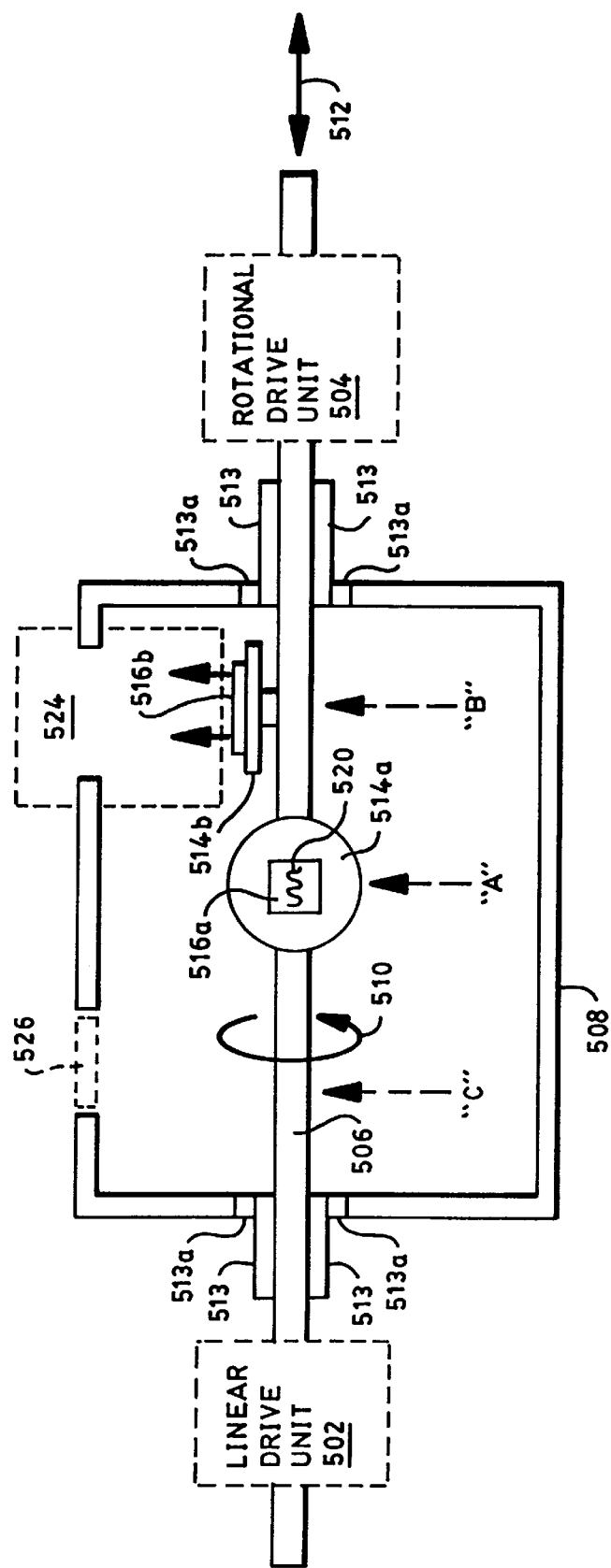
FIGS. 5 and 5A illustrate a two phase processing system constructed according to the invention, including two mounting surfaces on the rotating shaft to facilitate loading, unloading and processing of workpieces with increased efficiency.
Figure 5A:
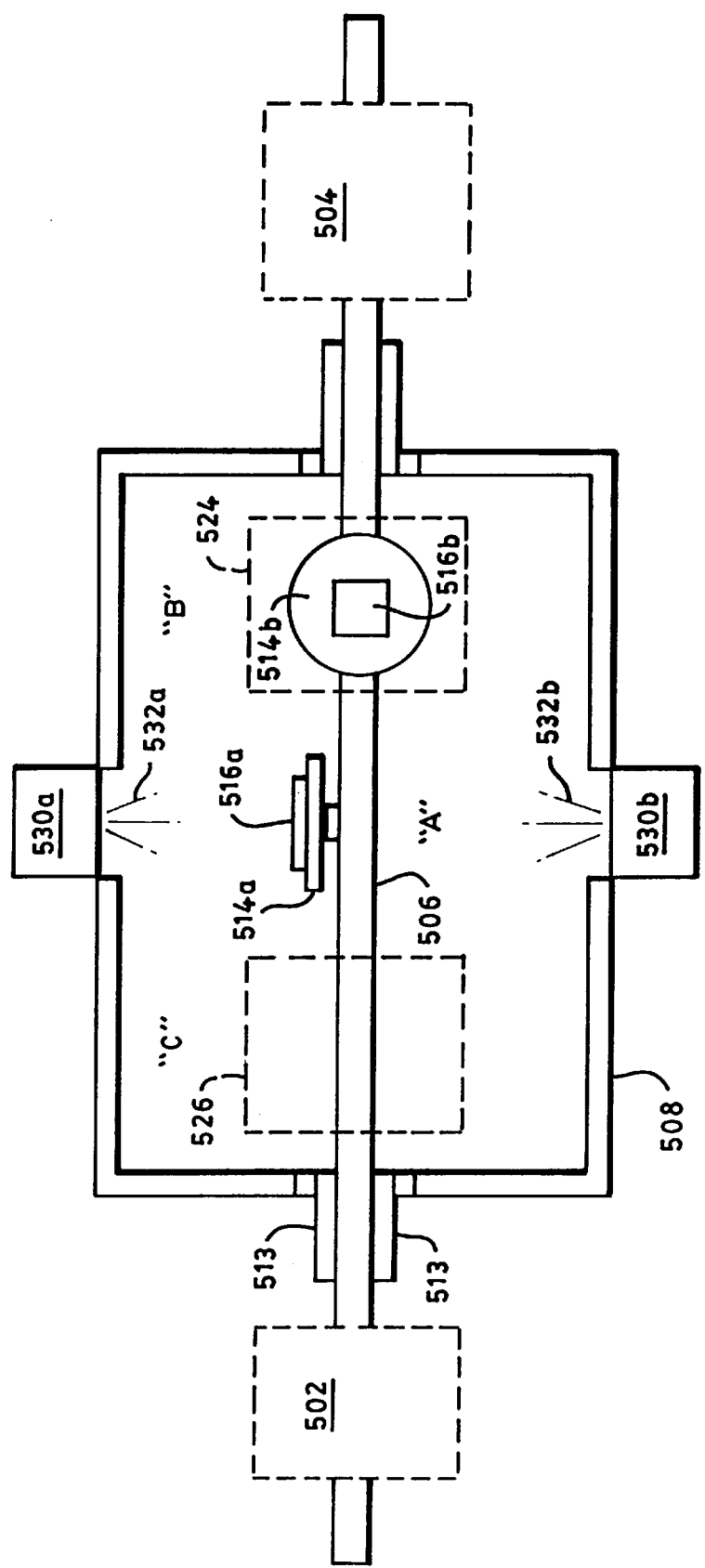

FIGS. 5 and 5A illustrate a two-phase processing system 500, constructed according to the invention. FIG. 5 shows a front view of the system 500; while FIG. 5A illustrates a top view of the system 500. Much like FIG. 1, a shaft 506 protrudes through both sides of a processing chamber wall 508. A rotational drive unit 504 operates to rotate the shaft 506 about direction 510; while the linear drive unit 502 operates to move the shaft along direction 512. Linear gas bearings 513 (and optional pliant members 513a) provide the interface between the shaft 506 and the chamber 508.

Two mounting surfaces 514 are provided within the system 500. Workpieces 516 are mounted to the surfaces 514; except that surface 514a is positioned for processing of workpieces 516a within the system 500 and surface 514b is positioned for loading and unloading of workpieces 516b. Mounting surfaces 514 are coupled to the shaft 506 such that they can be accessed through a load/unload portal (e.g., the portal 524). As illustrated, the load/unload procedures for workpieces 516b can occur even though workpieces 516a are under processed. Portal door 526 illustratively shows that the chamber 508 is sealed relative to the load/unload portal for workpieces 516a.

Once workpieces 516a are processed (and workpieces 516b are loaded onto surface 514b), the portal 524 is sealed and the shaft 506 is moved so that mounting surface 514a is moved from position "A" to position "C"; and mounting surface 514b is moved from position "B" to position "A", for processing. The shaft 506 is rotated by unit 504 so that the workpieces 516b are in position for processing.

Two ion source and scanning units 530a, 530b are used to scan workpieces mounted to separate mounting surfaces 514. The units 530 function, for example, as described above in connection with FIG. 2. The ion source and scanning units 530a, 530b generate ion beams 532a, 532b, respectively, as needed for the processing of the workpieces. With regard to FIG. 5A, unit 530a serves to process workpieces 516a, when in position "A"; and unit 530b serves to process workpieces 516b when rotated and translated to position "A".

System 500 thus provides for simultaneous loading and unloading of a first set of workpieces during processing of another set of workpieces, increasing production efficiency.

FIGS. 6, 6A, 6B, 6C and 6D provide alternative counter-balance techniques constructed according to the invention. These techniques help counter balance shafts when a system such as shown in FIG. 1 (i.e., self counter-balanced system) is rotated with the shaft parallel to gravity, or within systems which have shafts protruding through only one wall, such as described in U.S. Pat. No. 4,726,689. In each FIG. 6–6D, a shaft 600 passes through a wall 602 of a process chamber which is evacuated ("[VACUUM]"). For ease of illustration, only a portion of the chamber and shaft is shown. Linear gas bearings 604 (and optional pliant members 606) provide interface between the shaft 600 and the wall 602. The shaft 600 and associated chamber operate as described above, to provide for processing of workpieces within the chamber. The counter-balances of these figures operates to minimize the work required of control and motor equipment utilized to drive the shaft 600, thereby increasing accuracy and control with reduced errors.

Figure 6:
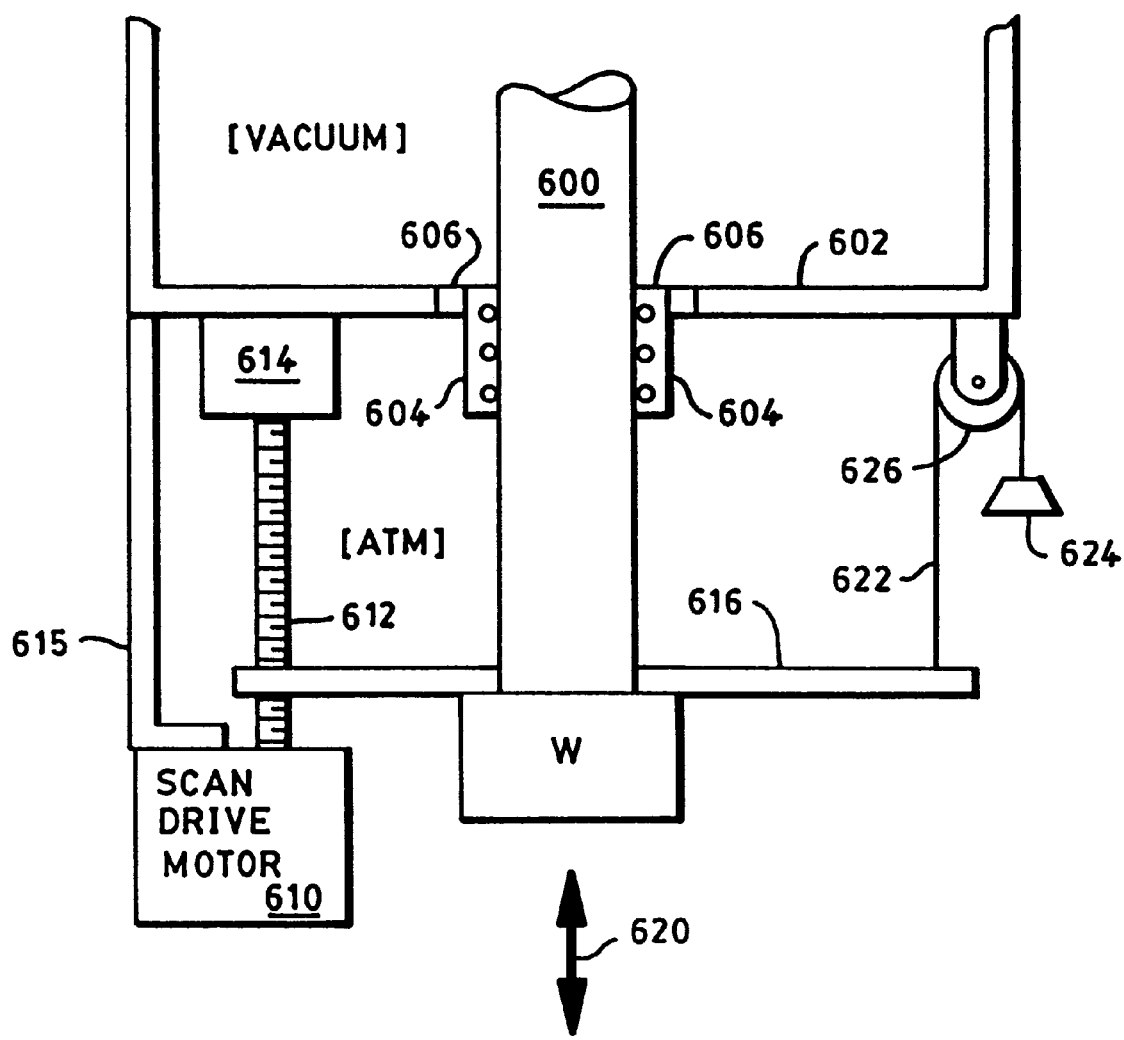
FIG. 6 illustrates one counter-balancing embodiment of the invention utilizing a mechanical counter-weight.

In FIG. 6, the shaft 600 aligns with gravity so that in effect it has a weight "W". The linear drive unit 610 includes a leadscrew 612 that connects between the unit 610 and the chamber mount 614. The shaft plate 616 mates with the leadscrew 612 so that actuation of the screw 612 raises or lowers the shaft 600 (providing linear motion 620). A mounting bracket 615 provides rigid connection between the chamber 602 and the unit 610. The plate 616 also connects with pull wire 622 connected to a counter weight 624 (with an approximate weight "W") through a pulley 626. The weight 624 operates to counter balance the shaft 600, greatly reducing the work and control required of the linear drive 610.

In FIG. 6A, the shaft 600 is also arranged so as to create a weight "W" in direction 640. However, instead of a weight-pulley, a pneumatic actuator or hydraulic piston 642 connects between the plate 616 and the chamber 602. The actuator/hydraulic 642 maintains constant internal air pressure through a vent 646 and plunger (or similar mechanism) 648 connected with the plate 616. As shown in FIGS. 6A1 and 6A2, for example, the actuator 642 maintains a constant pressure zone 643 acting over the piston area via (a) a back relieving pressure regulator 645 connected with a fluid supply 647 or (b) a constant pressure fluid supply 649 pressurized to the desired level by hydraulics or pneumatics. The mechanisms of FIGS. 6A1 and 6A2 maintain constant pressure regardless of actuator position or speed.

Figure 6B:
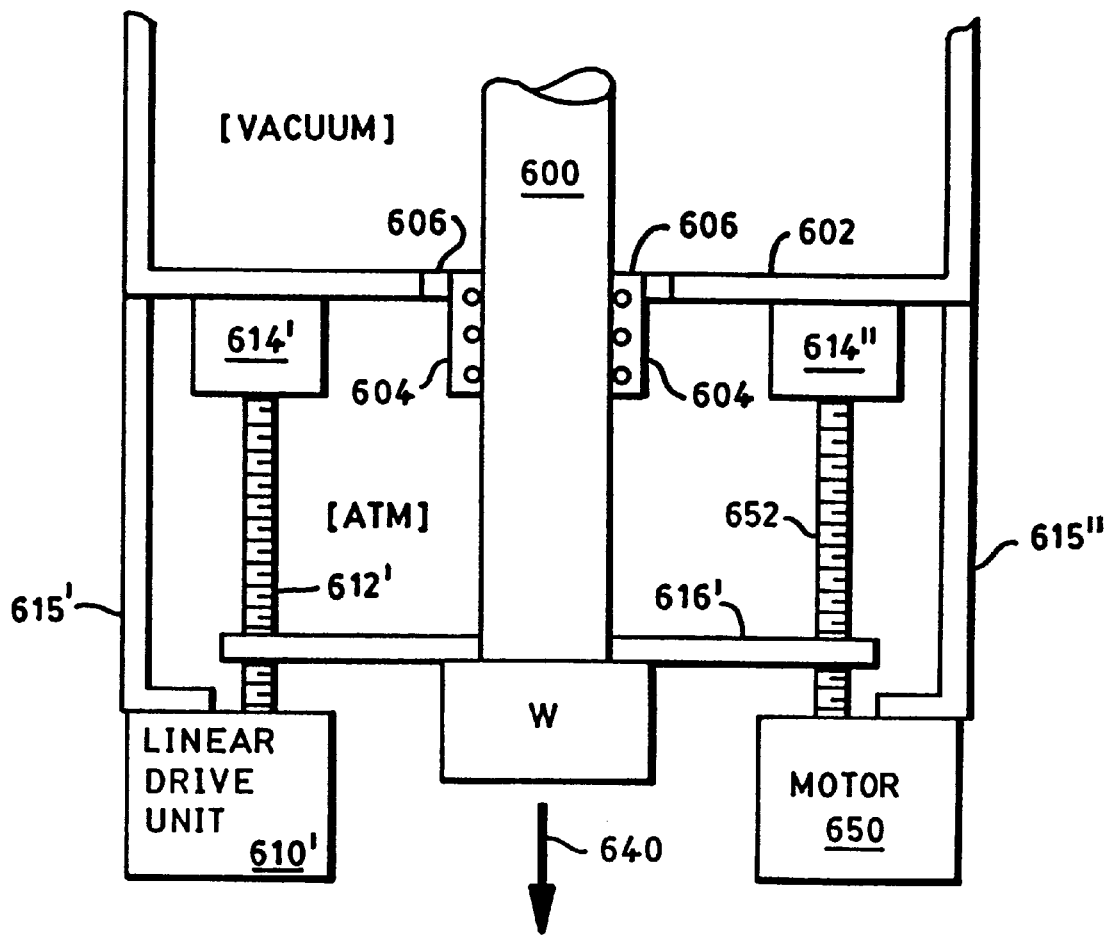
FIG. 6B illustrates one counter-balancing embodiment of the invention utilizing a constant drive torque motor.

In FIG. 6B, counter balance is achieved through a constant drive torque motor 650, driving its own separate leadscrew 652 (connected with the housing 602 via the mount 614"). The motor is connected to the wall 602 with bracket 615".

Figure 6C:
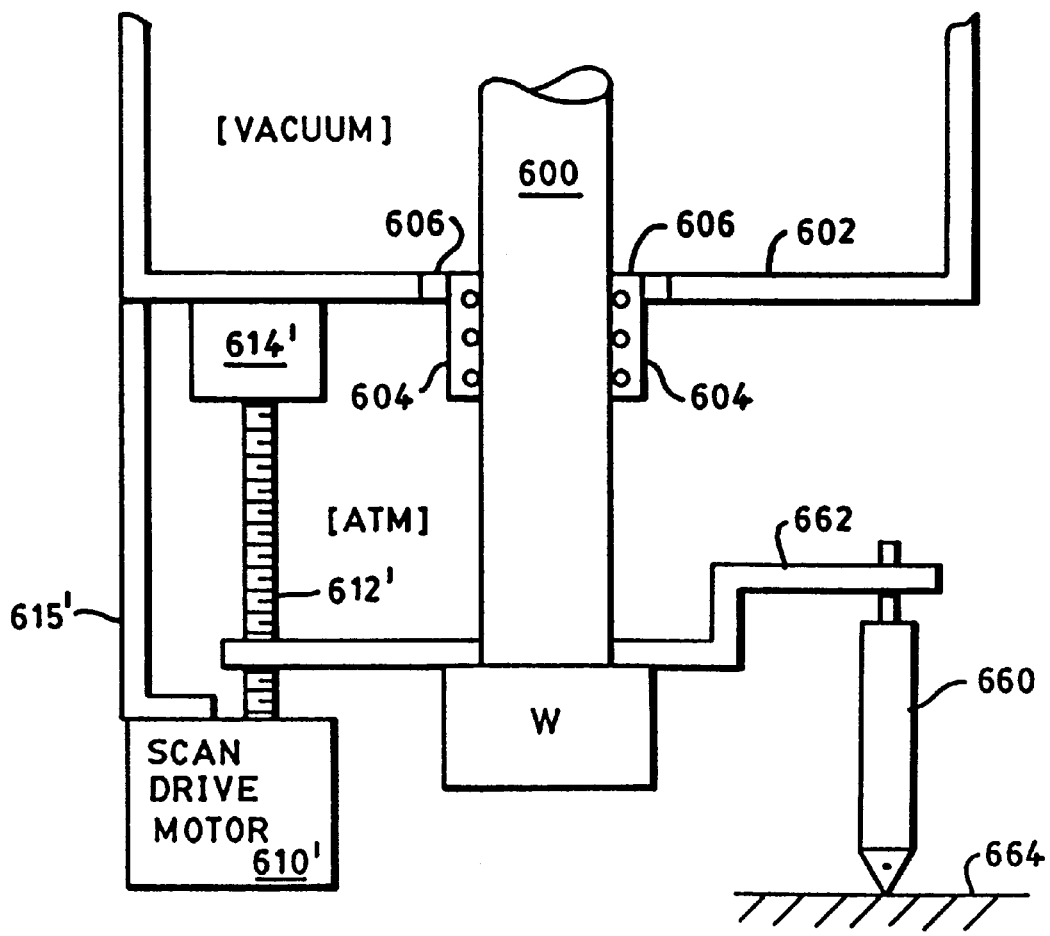
FIG. 6C illustrates one counter-balancing embodiment of the invention utilizing a spring.

In FIG. 6C, counter balance is achieve through a spring 660 applying a constant force onto a bracket 662 connected with the shaft 600. The spring 660 connects to an external surface 664 as its stationary location. Active drive of the shaft 600 is controlled through the scan drive motor 610', as above.

Figure 6D:
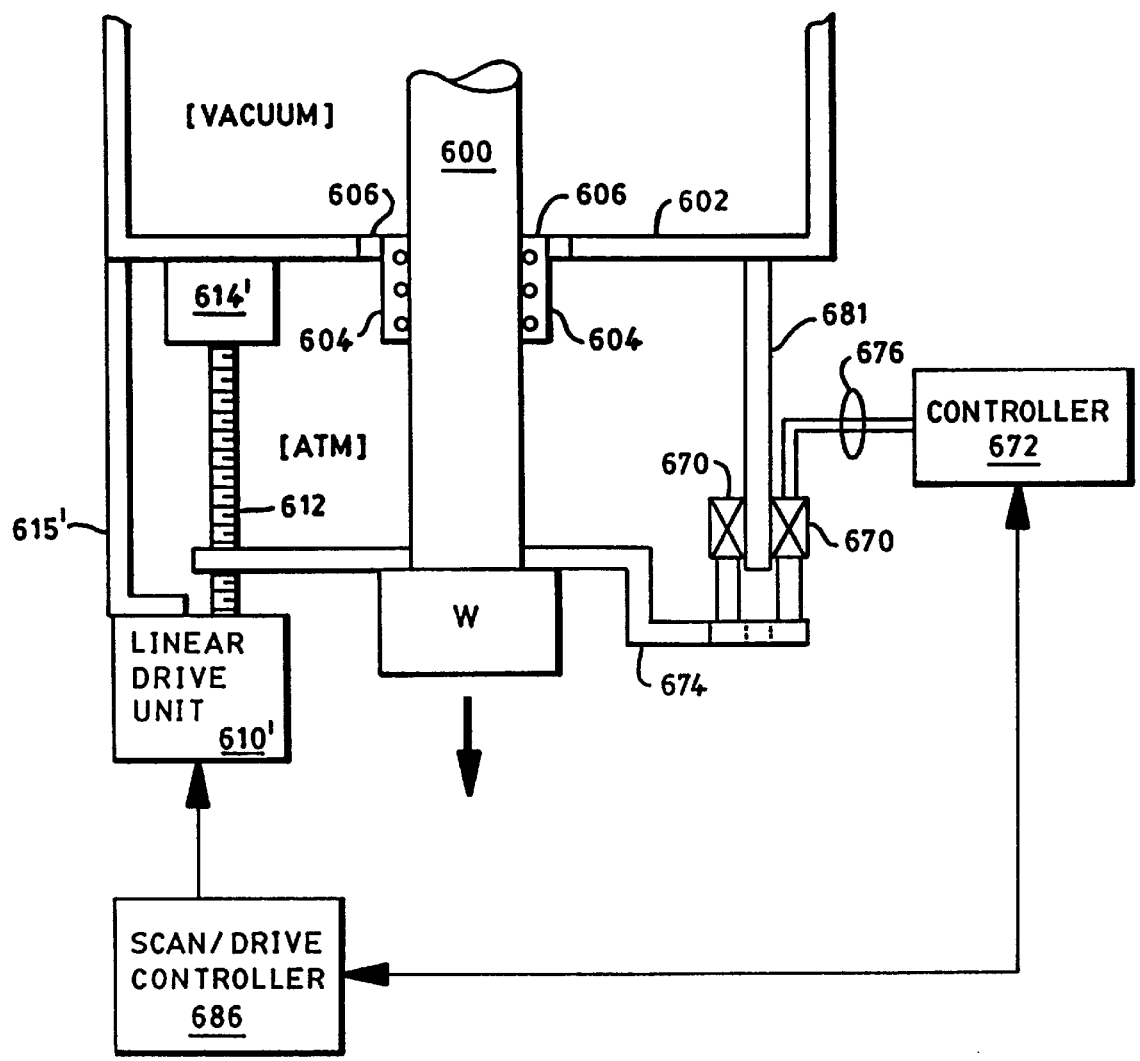
FIG. 6D illustrates one counter-balancing embodiment of the invention utilizing an electromagnetic subsystem.

In FIG. 6D, counter balance is achieved through electromagnets 670 and associated controller 672. The magnets 670 (e.g., solenoids) are supported by the mount 674 connected with the shaft 600. Lead wires 676 couple magnet 670 to the controller 672 which operates in conjunction with the scan drive controller 680. The controller 680 actively controls the linear position of the shaft 600, through the motor 610', and is typically part of the computer system of the entire scanning system (e.g., the system controller 21 of FIG. 1). An iron rod 681 rigidly couples to the housing 602 and passes between the magnets 670 to provide force to counterbalance the shaft 600.

Those skilled in the art should appreciate that the gas bearings discussed herein can include air bearings and, for example, bearings with compressed inert gases.

The invention thus attains the objects set forth above, among those apparent from preceding description. Since certain changes may be made in the above systems and methods without departing from the scope of the invention, it is intended that all matter contained in the above description or shown in the accompanying drawing be interpreted as illustrative and not in a limiting sense.

In view of the foregoing, what is claimed is:

1. Ion beam scanning system, comprising:
   an ion beam processing chamber;
   a shaft extending through two opposing walls of the chamber;
   linear gas bearings for coupling the shaft through the walls to provide for rotational and linear movement of the shaft;
   an ion source and scanning unit for generating an ion beam and for scanning a workpiece mounted on the shaft, the ion beam irradiating the workpiece at a selected angle, relative to the surface normal of the workpiece, defined by rotation of the shaft; and
   a linear drive for linearly moving the shaft so that the ion beam creates a raster pattern on the workpiece.

2. The system of claim 1, further comprising a rotational drive for rotating the shaft, selectively.

3. The system of claim 2, further comprising control electronics for controlling (a) the linear drive for linearly positioning the shaft, (b) the rotational drive for rotating the shaft, and (c) the ion source and scanning unit to set the raster pattern.

4. The system of claim 1, further comprising means for positioning the shaft to a first position to facilitate loading and unloading of the workpiece onto the shaft, and for positioning the shaft to a second position to facilitate processing of the workpiece.

5. The system of claim 1, further comprising active counter-balancing means to counter shaft weight to facilitate control of shaft position.

6. The system of claim 5, wherein the counter-balancing means comprises a mechanical weight coupled to the shaft and the chamber.

7. The system of claim 5, wherein the counter-balancing means comprises a pneumatic piston coupled to the shaft and the chamber.

8. The system of claim 5, wherein the counter-balancing means comprises a linear motor coupled to the shaft and the chamber.

9. The system of claim 5, wherein the counter-balancing means comprises a magnetic counter balance coupled to the shaft and the chamber.

10. The system of claim 1, wherein the shaft forms a hollow interior to provide electrical access through at least one of the walls.

11. The system of claim 1, further comprising a batch mounting structure coupled to the shaft for supporting, through processing, a plurality of workpieces mounted thereon.

12. The system of claim 11, further comprising a rotating drive motor coupled to the batch structure for rotating workpieces about a rotation point at the shaft.

13. The system of claim 11, further comprising means for simultaneously (i) rotating the batch structure, (ii) linearly translating the shaft, and (iii) scanning at least one workpiece with the ion beam on the batch structure for concurrently processing multiple workpieces.

14. A two phase ion beam scanning system, comprising:
   an ion beam processing chamber;
   a shaft extending through two opposing walls of the chamber;
   linear gas bearings for coupling the shaft through the walls to provide for rotational and linear movement of the shaft;
   a first ion source and scanning unit, constructed and arranged on one side of the chamber, for generating an ion beam substantially perpendicular to the shaft and for scanning a first target area mounted with the shaft at a first position, the ion beam irradiating the first target area at a selected angle, relative to the surface normal of the first target area, defined by rotation of the shaft;
   a second ion source and scanning unit, constructed and arranged on one side of the chamber, opposite to the first unit, for generating an ion beam substantially perpendicular to the shaft and for scanning a second target mounted with the shaft at a second position, the ion beam irradiating the second target area at a selected angle, relative to the surface normal of the second target area, defined by rotation of the shaft;
   means for loading or unloading workpieces at the first target area while scanning workpieces at the second target area;
   and;
   a linear drive for linearly moving the shaft.

15. A method of scanning an ion beam onto a plurality of workpieces within a process chamber, comprising the steps of:
   mounting the workpieces to a rotatable disc mounted to a shaft within the process chamber;
   rotating the disc on the shaft;
   irradiating a radial position on the disc with an ion beam, wherein each of the workpieces is doped with the beam while being rotated on the disc, the step of irradiating the workpieces with the ion beam being performed at a selected angle, relative to the surface normal of a workpiece being irradiated, defined by rotation of the shaft about its longitudinal axis; and
   moving the shaft linearly along its longitudinal axis to process each workpiece on the disc.

* * * * *